US012737515B2

(12) United States Patent
van Kessel et al.

(10) Patent No.: US 12,737,515 B2
(45) Date of Patent: Sep. 15, 2026

(54) ESTIMATING EMISSION SOURCE LOCATION FROM SATELLITE IMAGERY

(71) Applicant: International Business Machines Corporation, Armonk, NY (US)

(72) Inventors: Theodore G. van Kessel, Millbrook, NY (US); Levente Klein, Tuckahoe, NY (US); Bruce Gordon Elmegreen, Goldens Bridge, NY (US); Eloisa Bentivegna, Warrington (GB)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 17/809,037

(22) Filed: Jun. 27, 2022

(65) Prior Publication Data

US 2023/0418999 A1 Dec. 28, 2023

(51) Int. Cl.

| | |
|---|---|
| ***G06F 30/27*** | (2020.01) |
| ***G06F 30/28*** | (2020.01) |
| ***G06N 20/20*** | (2019.01) |
| ***G06T 3/40*** | (2006.01) |
| ***G06T 7/73*** | (2017.01) |

(52) U.S. Cl.

CPC .............. *G06F 30/27* (2020.01); *G06F 30/28* (2020.01); *G06N 20/20* (2019.01); *G06T 3/40* (2013.01); *G06T 7/73* (2017.01); *G06T 2207/10032* (2013.01); *G06T 2207/20081* (2013.01)

(58) Field of Classification Search

CPC ........................................................ G06F 30/27

See application file for complete search history.

(56) References Cited

U.S. PATENT DOCUMENTS

| | | | | |
|---|---|---|---|---|
| 5,206,818 | A | 4/1993 | Speranza | |
| 10,948,471 | B1 * | 3/2021 | MacMullin ........ | G01N 33/0047 |
| 2011/0213554 | A1 | 9/2011 | Archibald | |
| 2015/0019185 | A1 | 1/2015 | Cunningham | |
| 2017/0134497 | A1 * | 5/2017 | Harter ................ | G01N 33/0004 |

(Continued)

FOREIGN PATENT DOCUMENTS

| | | | |
|---|---|---|---|
| CA | 2758747 | A1 | 8/2021 |
| CN | 104181276 | A | 12/2014 |

OTHER PUBLICATIONS

Ba et al., "SmokeNet: Satellite Smoke Scene Detection Using Convolutional Neural Network with Spatial and Channel-Wise Attention", Remote Sensing 11, No. 14: 1702, 2019, 22 Pages.

(Continued)

*Primary Examiner* — Hyun D Park

(74) *Attorney, Agent, or Firm* — Stephen R. Yoder

(57) ABSTRACT

In an approach for estimating emission source location from satellite plume data, a processor creates a dataset of plume concentration data. A processor down samples the dataset to an array at satellite resolution. A processor partitions the array into two separate datasets according to a preset proportion. A processor trains two machine learning models on at least one of the two separate datasets, wherein a first machine learning model of the two machine learning models is for identifying a presence of a plume and a second machine learning model of the two machine learning models is for identifying a source position and magnitude of the plume. A processor applies the two machine learning models to new concentration data.

19 Claims, 4 Drawing Sheets

(56) References Cited

U.S. PATENT DOCUMENTS

| | | | | |
|---|---|---|---|---|
| 2020/0051260 | A1* | 2/2020 | Shen | G06F 18/214 |
| 2020/0155881 | A1* | 5/2020 | Tohidi | G06T 3/4046 |
| 2020/0159397 | A1 | 5/2020 | Tohidi | |
| 2021/0398289 | A1 | 12/2021 | Schmidt | |
| 2022/0262116 | A1* | 8/2022 | Hosseini | G06V 10/764 |
| 2023/0059007 | A1* | 2/2023 | Agrawal | G06T 11/00 |
| 2023/0362335 | A1* | 11/2023 | Kastner | H04N 7/181 |

OTHER PUBLICATIONS

Brandt et al., "Methane Leaks from North American Natural Gas Systems", Science, vol. 343, Feb. 14, 2014, ResearchGate, 4 Pages.
Clarisse et al., "Tracking down global NH3 point sources with wind-adjusted super resolution", Atmospheric Measurement Techniques, 12, 2019, 17 Pages.
Hirst et al., "Locating and quantifying gas emission sources using remotely obtained concentration data", Atmospheric Environment, vol. 74, Aug. 2013, ScienceDirect, 18 Pages.
Jacob et al., "Satellite observations of atmospheric methane and their value for quantifying methane emissions", Atmospheric Chemistry and Physics, vol. 16, issue 22, 2016, 26 Pages.
Keats et al., "Efficiently characterizing the origin and decay rate of a nonconservative scalar using probability theory", Ecological Modelling 205, 2007, ScienceDirect, 16 Pages.
Kuhlmann et al., "Detectability of CO2 emission plumes of cities and power plants with the Copernicus Anthropogenic CO2 Monitoring (CO2M) mission", Atmospheric Measurement Techniques, 12, 2019, 25 Pages.
Larsen et al., "A deep learning approach to identify smoke plumes in satellite imagery in near-real time for health risk communication", Journal of Exposure Science & Environmental Epidemiology, vol. 31, 2021, 12 Pages.
Mazzoni et al., "An operational MISR pixel classifier using support vector machines", Remote Sensing of Environment, 107, 2007, ScienceDirect, 10 Pages.
Pomareda et al., "Chemical Source Localization Fusing Concentration Information in the Presence of Chemical Background Noise †", Sensors 2017, 17, 904, Apr. 20, 2017, 23 Pages.
Ramasubramanian et al., "Pixel Level Smoke Detection Model with Deep Neural Network", SPIE Remote Sensing 2019, Strasbourg, France, Sep. 9-12, 2019, 35 Pages.
Sharan et al., "A point-source reconstruction from concentration measurements in low-wind stable conditions", Quarterly Journal of the Royal Meteorological Society 138 (668), 2012, 3 Pages. (Abstract Only).
Sharan et al., "Least Square Data Assimilation for Identification of the Point Source Emissions", Pure & Applied Geophysics; Basel vol. 169, Issue. 3, Mar. 2012, 10 Pages. (Abstract Only).
Sheng et al., "High-resolution inversion of methane emissions in the Southeast US using SEAC4RS aircraft observations of atmospheric methane: anthropogenic and wetland sources", Atmospheric Chemistry and Physics, vol. 18, issue 9, 2018, 9 Pages.
Stanev et al., "Identification of release sources in advection-diffusion system by machine learning combined with Green's function inverse method", Applied Mathematical Modelling 60, 2018, ScienceDirect, 26 Pages.
Varon et al., "Quantifying methane point sources from fine-scale satellite observations of atmospheric methane plumes", Atmospheric Measurement Techniques, 11, 2018, 14 Pages.
Wen et al., "Wildfire Smoke Plume Segmentation Using Geostationary Satellite Imagery", Tackling Climate Change with Machine Learning workshop at ICML 2021, Sep. 3, 2021, 7 Pages.
Yee, Eugene, "Theory for Reconstruction of an Unknown Number of Contaminant Sources using Probabilistic Inference", Boundary-Layer Meteorology, vol. 127, 2008, 36 Pages.
Zhang et al., "Quantifying methane emissions from the largest oil-producing basin in the United States from space", Science Advances, vol. 6, Issue 17, Apr. 22, 2020, 9 Pages.
Zhuk et al., "On Source-Term Parameter Estimation for Linear Advection-Diffusion Equations with Uncertain Coefficients", SIAM Journal on Scientific Computing, vol. 38, Issue 4, 2016, 2 Pages. (Abstract Only).

* cited by examiner

ESTIMATING EMISSION SOURCE LOCATION FROM SATELLITE IMAGERY

BACKGROUND OF THE INVENTION

The present invention relates generally to the field of data processing, and more particularly to estimating emission source location from satellite imagery.

Ground truth emission data is rarely available, but public data provides small amounts for known releases of methane (i.e., a greenhouse gas (GHG)). The problem with this public data is that the release moment and amount is not always well aligned with available satellite data. Many sources are intermittent in nature and will emit stochastically requiring almost constant remote satellite observations to capture emission patterns. Satellites observe earth from space at many electromagnetic bands. Among these are observations that when processed yield information on atmospheric concentrations of GHGs. These observations allow for monitoring of GHG data and are useful in climate models. Examples of satellites in this category include, but are not limited to, the Sentinel-5P and private satellite data. An issue with satellite concentration data is that it is typically less resolved in time and space than needed. Additionally, granular local wind data is not easily available. Thus, direct inversion of concentration data and wind data may not be possible.

SUMMARY

Aspects of an embodiment of the present invention disclose a method, computer program product, and computer system for estimating emission source location from satellite plume data. A processor creates a dataset of plume concentration data. A processor down samples the dataset to an array at satellite resolution. A processor partitions the array into two separate datasets according to a preset proportion. A processor trains two machine learning models on at least one of the two separate datasets, wherein a first machine learning model of the two machine learning models is for identifying a presence of a plume and a second machine learning model of the two machine learning models is for identifying a source position and magnitude of the plume. A processor applies the two machine learning models to new concentration data.

DETAILED DESCRIPTION

Figure 1:
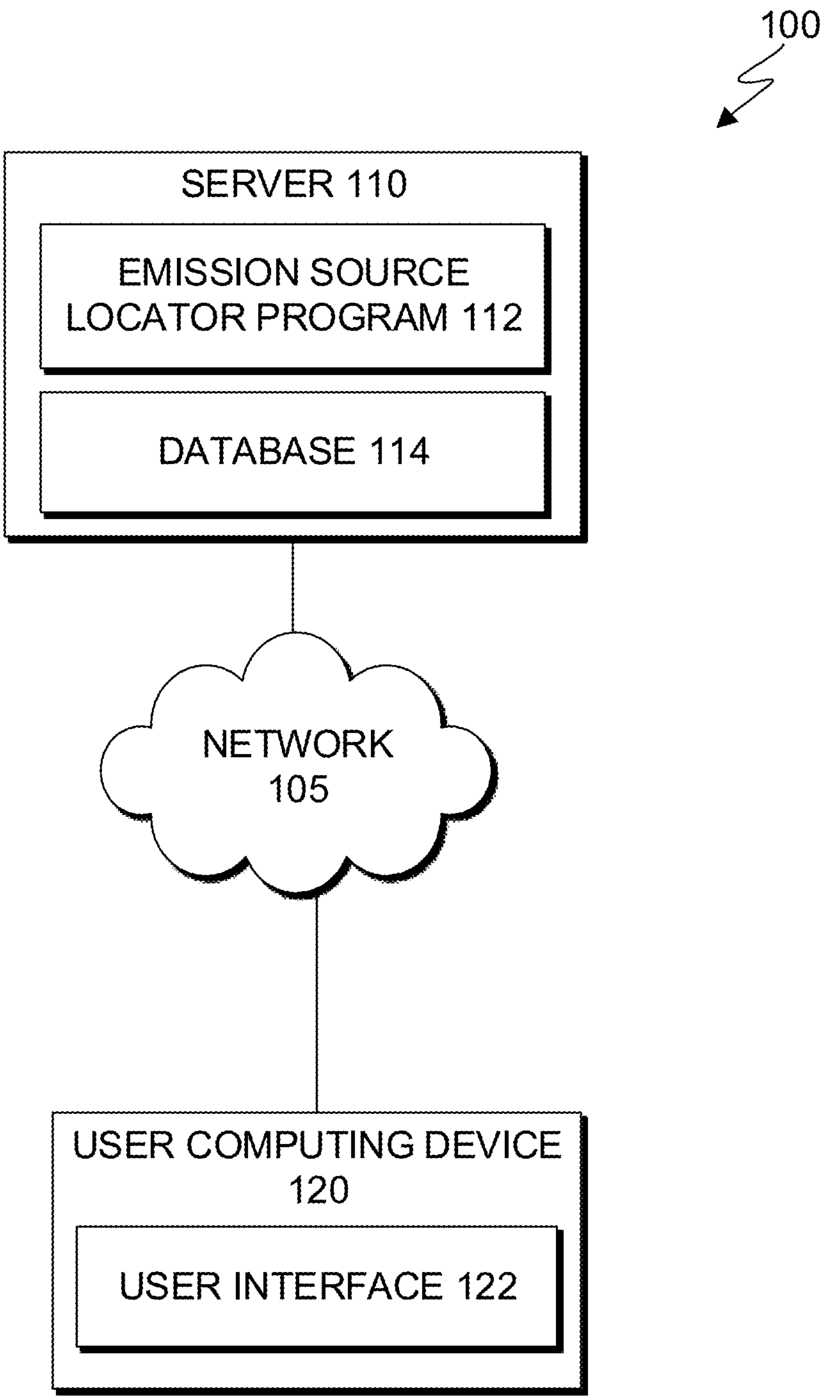
FIG. 1 is a functional block diagram illustrating a distributed data processing environment, in accordance with an embodiment of the present invention.

Embodiments of the present invention recognize that the current art for identifying emission sources in concentration data rely on processing whole images at a time to identify features, e.g., concentration gradients or peaks in the data, that are used to estimate a plume location. These methods often rely on simplification and inversion of the advection diffusion equation. These estimates are in some cases further refined using large-scale wind data to bias the estimates of the plume source locations.

Embodiments of the present invention provide a system and method for estimating emission source location from satellite plume data. Embodiments of the present invention use and analyze imagery ranging from visible range to radio frequencies to produce emission concentration data that is used to identify sources of the emissions. Different spectral bands may create different concentration maps as they may have slightly different sensitivity to absorption by GHG of the light. While the scattering and absorption sensitivity can change, the underlying dispersion of the GHG or particulates are well understood across the whole observation ranges. The emissions can be any type of pollution emission, e.g., GHGs, particulates, etc. GHGs of interest include, but are not limited to, methane, carbon dioxide, nitrogen dioxide, other oxides of nitrogen, sulfur dioxide, and hydrogen sulfide.

Embodiments of the present invention utilize synthetic and/or actual plume concentration data and known source position data to train a neural network to estimate the presence and location of a source at a given location in actual satellite data. Embodiments of the present invention further embed variable wind conditions and source magnitudes into the training data, just not as an explicit input. The neural network is able to estimate first the presence and then second the position of a source with subpixel resolution. Embodiments of the present invention separate computing the presence and position of a source into two sequence steps: (1) test to determine the presence or absence of a source in a center pixel and (2) if present, determine the subpixel location of the source inside that center pixel. Embodiments of the present invention look to train a neural network to identify a single point emission source in a two-dimensional (2D) concentration field at better than satellite resolution (i.e., subpixel resolution). In case continuous satellite observation is not available, then the system will try to reconstruct the emission from snapshots where the plume may or may not be present.

Embodiments of the present invention utilize a synthetic set of spatial GHG concentration data for an associated set of source positions, magnitudes, and time variable ground conditions including wind speed, wind direction, wind turbulence, and atmospheric conditions that are generated at a high resolution. Alternatively, embodiments of the present invention utilize satellite concentration data at a given resolution with known emission source locations as a dataset. Alternatively, embodiments of the present invention utilize a combination of synthetic data generated from physics models that have higher spatial and temporal resolution than the satellite data and models the distribution of the plumes using the weather data by considering both the two- and three-dimensional distribution of the data. If three dimensional simulations are carried out, the data can be sliced in a horizontal direction to assess the concentration maps at different heights above the ground. These physics models can be computational fluid dynamics (CFD) models or stochastic Lagrangian models where partial differential equations like advection diffusion or Navier Stokes equations are solved at arbitrarily high spatial and temporal resolution. If the synthetic data are at a higher resolution, the data are reduced to satellite resolution by resampling and then used to train multiple sequential neural network models. Embodiments of the present invention apply satellite data to the physics simulations models to determine the presence or absence of a source at a given position and, if present, a location of the source. These datasets can be calculated using a variety of plume models, e.g., superposition of gaussians (SOG), puff models, and computational fluid dynamics models.

It is to be understood that the terms “emission”, “dispersion”, and “plume” are used interchangeably within the present invention. It is to be understood that the term “source” refers to “an emission source”, “a plume source”, or “any source of pollutant”. It is to be understood that the emission from the source is carried around by a surrounding fluid to make the plume in the surrounding fluid, which, in one embodiment, can be air. It is also understood that the pollution can be lighter or can be heavier than air and naturally will rise to the upper atmosphere or will fall to ground.

Implementation of embodiments of the invention may take a variety of forms, and exemplary implementation details are discussed subsequently with reference to the Figures.

FIG. 1 is a functional block diagram illustrating a distributed data processing environment, generally designated 100, in accordance with one embodiment of the present invention. The term “distributed,” as used herein, describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes server 110 and user computing device 120, interconnected over network 105. Network 105 can be, for example, a telecommunications network, a local area network (LAN), a wide area network (WAN), such as the Internet, or a combination of the three, and can include wired, wireless, or fiber optic connections. Network 105 can include one or more wired and/or wireless networks capable of receiving and transmitting data, voice, and/or video signals, including multimedia signals that include voice, data, and video information. In general, network 105 can be any combination of connections and protocols that will support communications between server 110, user computing device 120, and other computing devices (not shown) within distributed data processing environment 100.

Server 110 can be a standalone computing device, a management server, a web server, a mobile computing device, or any other electronic device or computing system capable of receiving, sending, and processing data. In other embodiments, server 110 can represent a server computing system utilizing multiple computers as a server system, such as in a cloud computing environment. In another embodiment, server 110 can be a laptop computer, a tablet computer, a netbook computer, a personal computer (PC), a desktop computer, a personal digital assistant (PDA), a smart phone, or any programmable electronic device capable of communicating with user computing device 120 and other computing devices (not shown) within distributed data processing environment 100 via network 105. In another embodiment, server 110 represents a computing system utilizing clustered computers and components (e.g., database server computers, application server computers, etc.) that act as a single pool of seamless resources when accessed within distributed data processing environment 100. Server 110 includes emission source locator program 112 and database 114. Server 110 may include internal and external hardware components, as depicted and described in further detail with respect to FIG. 4.

Emission source locator program 112 operates to estimate an emission source location from satellite plume data. In the depicted embodiment, emission source locator program 112 is a standalone program. In another embodiment, emission source locator program 112 may be integrated into another software product, e.g., a data analytics software package. Emission source locator program 112 is depicted and described in further detail with respect to FIG. 2.

Database 114 operates as a repository for data received, used, and/or output by emission source locator program 112. Data received, used, and/or generated may include, but are not limited to, synthetic plume concentration data computed from a synthetic plume model, actual satellite concentration data, datasets created from a combination of synthetic and actual plume data, and any other data received, used, and/or output by emission source locator program 112. Database 114 can be implemented with any type of storage device capable of storing data and configuration files that can be accessed and utilized by server 110, such as a hard disk drive, a database server, or a flash memory. In an embodiment, database 114 is accessed by emission source locator program 112 to store and/or to access the data. In the depicted embodiment, database 114 resides on server 110. In another embodiment, database 114 may reside on another computing device, server, cloud server, or spread across multiple devices elsewhere (not shown) within distributed data processing environment 100, provided that emission source locator program 112 has access to database 114.

User computing device 120 operates as a computing device associated with a user on which the user can interact with emission source locator program 112 through an application user interface. In the depicted embodiment, user computing device 120 includes an instance of user interface 122. In an embodiment, user computing device 120 can be a laptop computer, a tablet computer, a smart phone, a smart watch, an e-reader, smart glasses, wearable computer, or any programmable electronic device capable of communicating with various components and devices within distributed data processing environment 100, via network 105. In general, user computing device 120 represents one or more programmable electronic devices or combination of programmable electronic devices capable of executing machine readable program instructions and communicating with other computing devices (not shown) within distributed data processing environment 100 via a network, such as network 105.

User interface 122 provides an interface between emission source locator program 112 on server 110 and a user of user computing device 120. In one embodiment, user interface 122 is a mobile application software. Mobile application software, or an “app,” is a computer program designed to run on smart phones, tablet computers, and other mobile computing devices. In one embodiment, user interface 132 may be a graphical user interface (GUI) or a web user interface (WUI) that can display text, documents, web browser windows, user options, application interfaces, and instructions for operation, and include the information (such as graphic, text, and sound) that a program presents to a user and the control sequences the user employs to control the program. User interface 122 enables a user of user computing device 130 to input data and view and/or manage output of emission source locator program 112.

Figure 2:
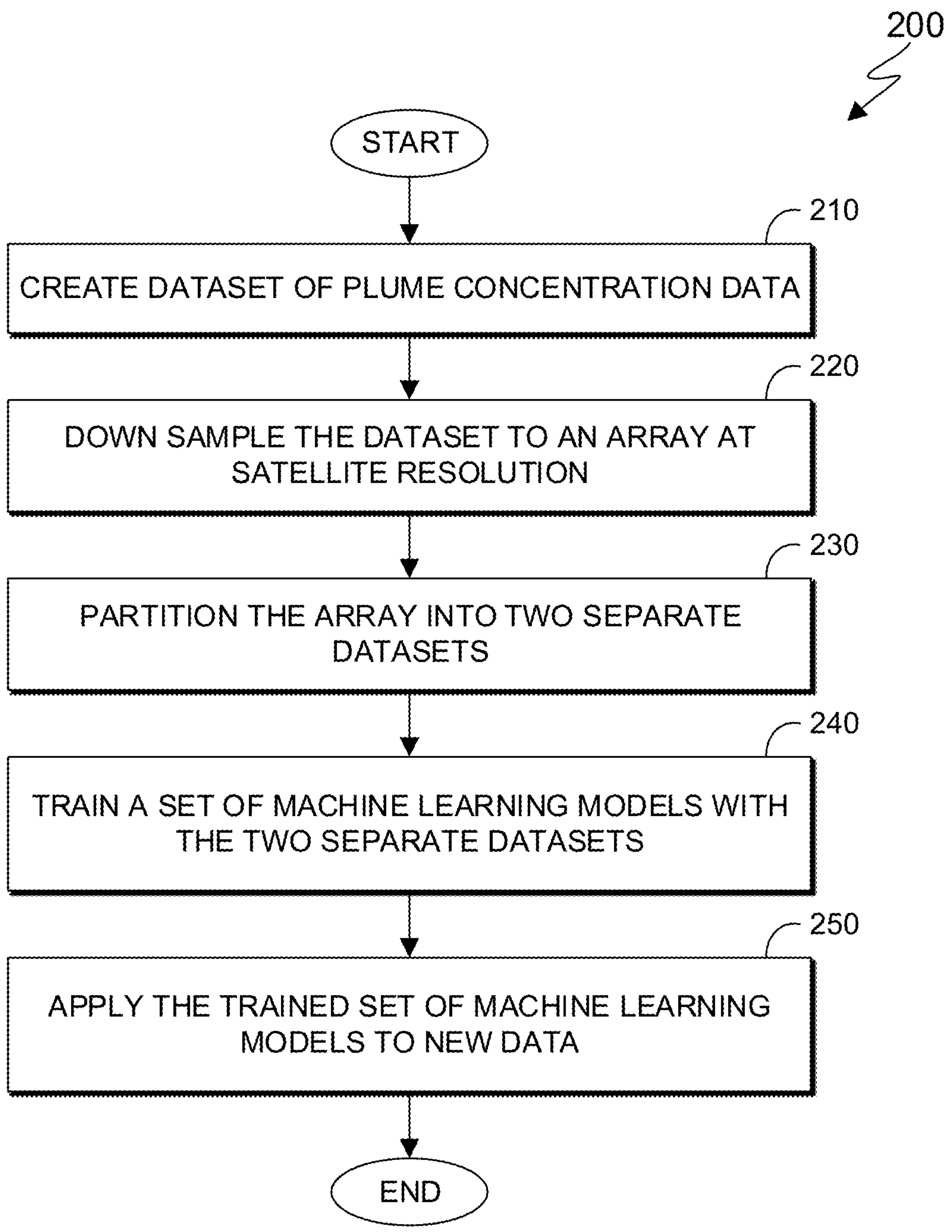
FIG. 2 is a flowchart depicting operational steps of an emission source locator program, for estimating an emission source location from satellite plume data, running on a server of the distributed data processing environment of FIG. 1 in accordance with an embodiment of the present invention.

FIG. 2 is a flowchart 200 depicting operational steps of emission source locator program 112, for estimating an emission source location from satellite plume data, running on server 110 of distributed data processing environment 100 of FIG. 1 in accordance with an embodiment of the present invention. It should be appreciated that the process depicted in FIG. 2 illustrates one possible iteration of emission source locator program 112.

In step 210, emission source locator program 112 creates a dataset of plume concentration data. In an embodiment, emission source locator program 112 creates a dataset of plume concentration data using a synthetic plume model to compute 2D concentration data for a variety of wind and atmospheric conditions from variable positions and at variable magnitudes. In the situation in which the plume model performs the computation at a higher resolution than can be observed with a given satellite, emission source locator program 112 reduces the resulting dataset in dimension by re-sampling to satellite resolution. As would be recognized by a person of skill in the art, many plume models exist and can be used to create the dataset including, but not limited to, superposition of gaussians (SOG) model, puff models, and CFD models.

In another embodiment, emission source locator program 112 creates a dataset of plume concentration data by collecting actual 2D satellite concentration observations (i.e., data) at a given resolution from known emission source locations. In yet another embodiment, emission source locator program 112 creates a dataset of plume concentration data using both the synthetic plume concentration data and the actual satellite concentration data.

Figure 3:
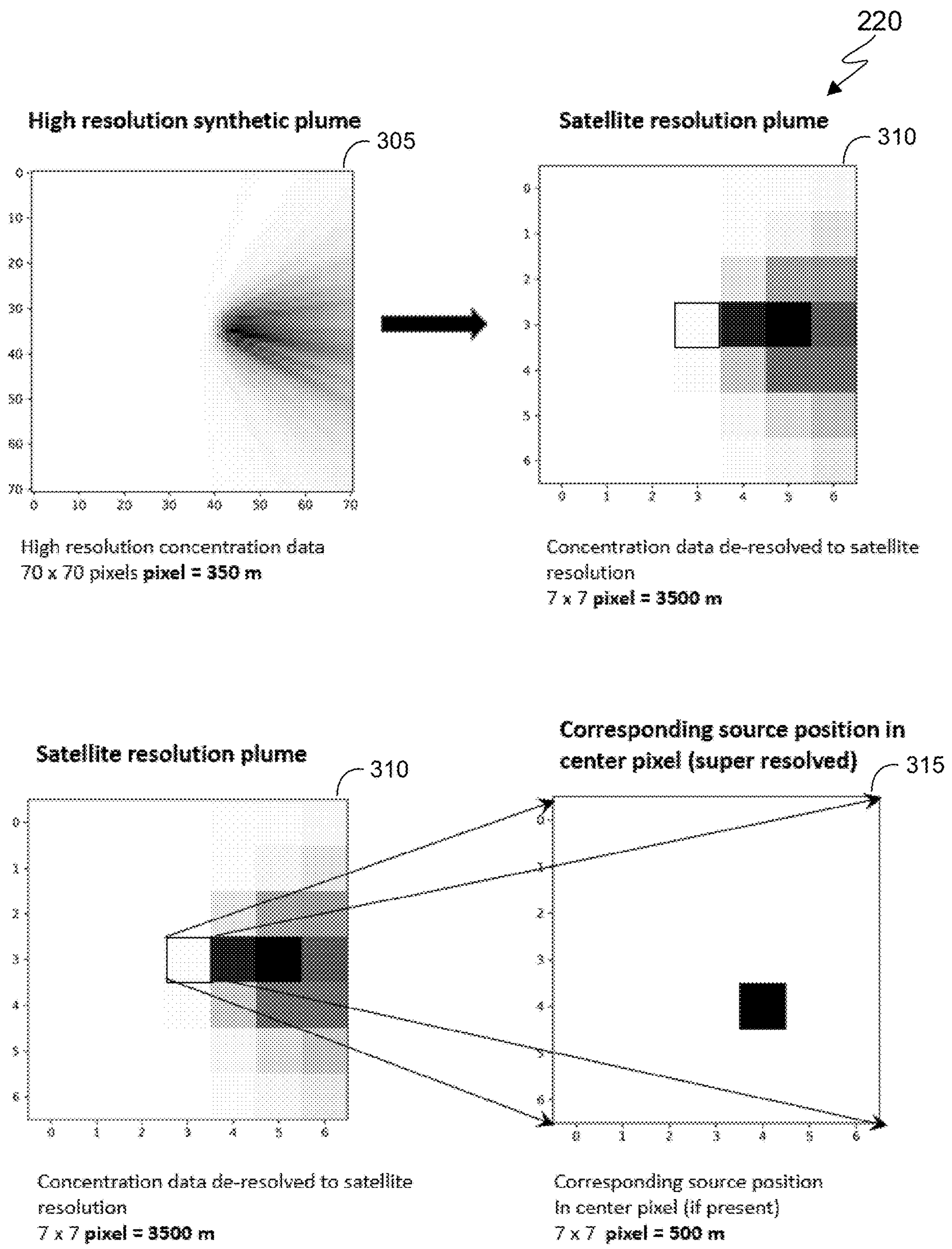
FIG. 3 is an example process flow of a downsampling step of the emission source location program, in accordance with an embodiment of the present invention.

In step 220, emission source locator program 112 down samples the dataset to an array at satellite resolution. In an embodiment, emission source locator program 112 down samples the dataset by arranging data of the dataset as an array (i.e., patch), e.g., 7×7 pixels array of concentration data, with the plume at or near the center of the array. The numbers used in this example are representative and the high-resolution images can have an arbitrarily fine spatial resolution. FIG. 3 is an example process flow of this downsampling step 220 with high resolution synthetic plume data 305 at 70×70 pixels (exemplified by a resolution of 350 m per pixel) that is down sampled by emission source locator program 112 to satellite resolution plume data array 310 at 7×7 pixels (of resolution 3500 m per pixel). The down sampling can happen on a grid that fills the original extent of the images from plume data 305, where a new resolution grid is fitted with different locations to create multiple datasets where the high-resolution image is sampled. In another embodiment, emission source locator program 112 shifts the grid to create down sampled array 310 where the averaging can be a statistical feature like mean, average, maximum, or minimum of all values of the fine resolution pixels falling within the grid cell of the coarser image. Ideally, half of this array data contains the plume with the source location in a center or off-center pixel with the remainder containing no plume. In an embodiment, emission source locator program 112 expresses a position of the plume source as a position in the center pixel of the array at higher resolution than the high-resolution corresponding image resolution, e.g., center pixel array 315 as shown in FIG. 3. An expanded view of the center pixel array 315 can be converted into a flattened array for processing by a machine learning model, in which the flattened array is a one-dimensional array made by arranging the pixels in the 2D array of center pixel array 315 into a linear sequence. In an embodiment, emission source locator program 112 encodes the source position as a single number corresponding to the pixel position in the center pixel array (i.e., relative to the center pixel) at high resolution. In an embodiment, emission source locator program 112 aggregates the associated plume array and position value in a single dataset. In the case where the source position is outside the center pixel, emission source locator program 112 encodes the position value as zero (0).

In step 230, emission source locator program 112 partitions the array into two separate datasets. In an embodiment, emission source locator program 112 partitions or splits the array dataset created in step 220 into two separate datasets that can be divided according to a preset proportion, e.g., 80% for training and 20% for validation. A first dataset (e.g., containing 80% of the data) of the two separate datasets is used to train a first machine learning model to identify the presence (or not) of a plume in the center pixel and train a second machine learning model to identify the position of the plume (if one is identified by the first machine learning model) as the coded position entries in the first dataset used to identify the location in the flattened array from previous step 220. For this first dataset, emission source locator program 112 recodes position entries as zero (0) when the plume source is outside the center pixel and one (1) when the plume source is contained in the center pixel. A second dataset (e.g., containing 20% of the data) of the two separate datasets is used to validate the results of the first machine learning model and the second machine learning model.

In step 240, emission source locator program 112 trains a set of machine learning models with the two separate datasets. In an embodiment, emission source locator program 112 trains and validates a set of machine learning models with the two separate datasets, respectively. In an embodiment, the set of machine learning models includes two neural network models, in which one is for identifying the presence of a plume and the other is for identifying the source position of the plume. Types of machine learning models that can be used include, but are not limited to, linear autoencoder, convolutional autoencoder, modified Resnet-18, random forest classifier, generative adversarial network (GAN). The key property is the ability of the trained models to learn plume shapes to allow the position of the plume source to be located with better than single pixel precision. Additionally, the neural network model for identifying the source position of the plume is also trained for identifying a magnitude of the plume as input training data contains plumes with given positions and magnitude.

In step 250, emission source locator program 112 applies the trained set of machine learning models to new data. In an embodiment, emission source locator program 112 applies the trained set of machine learning models to new (i.e., more current, newly collected, or real-time) satellite concentration data that is downsampled to a data patch, e.g., 7×7 pixels. In an embodiment, emission source locator program 112 applies the trained set of machine learning models to each pixel of the data patch in sequence. Again, if the first model determines the plume source to be in the center pixel, then the second model is used to determine the source location and magnitude of the plume. As each pixel is run through the set of machine learning models, emission source locator program 112 logs (i.e., stores in some manner) the position of any detected plume sources, in which the individual pixel being run through the models and the subpixel position output by the second machine learning model are combined mathematically to form a single coordinate and logged. In other words, responsive to receiving an output from the second machine learning model of a subpixel position of a detected plume source, emission source locator program 112 mathematically combines the individual pixel being run through the models and the subpixel position. In some embodiments, emission source locator program 112 excludes border pixels of the data patch from analysis by the set of machine learning models. In some embodiments, emission source locator program 112 outputs the log of positions of any detected plume sources, e.g., to a user of user computing device 120 through user interface 122.

Figure 4:
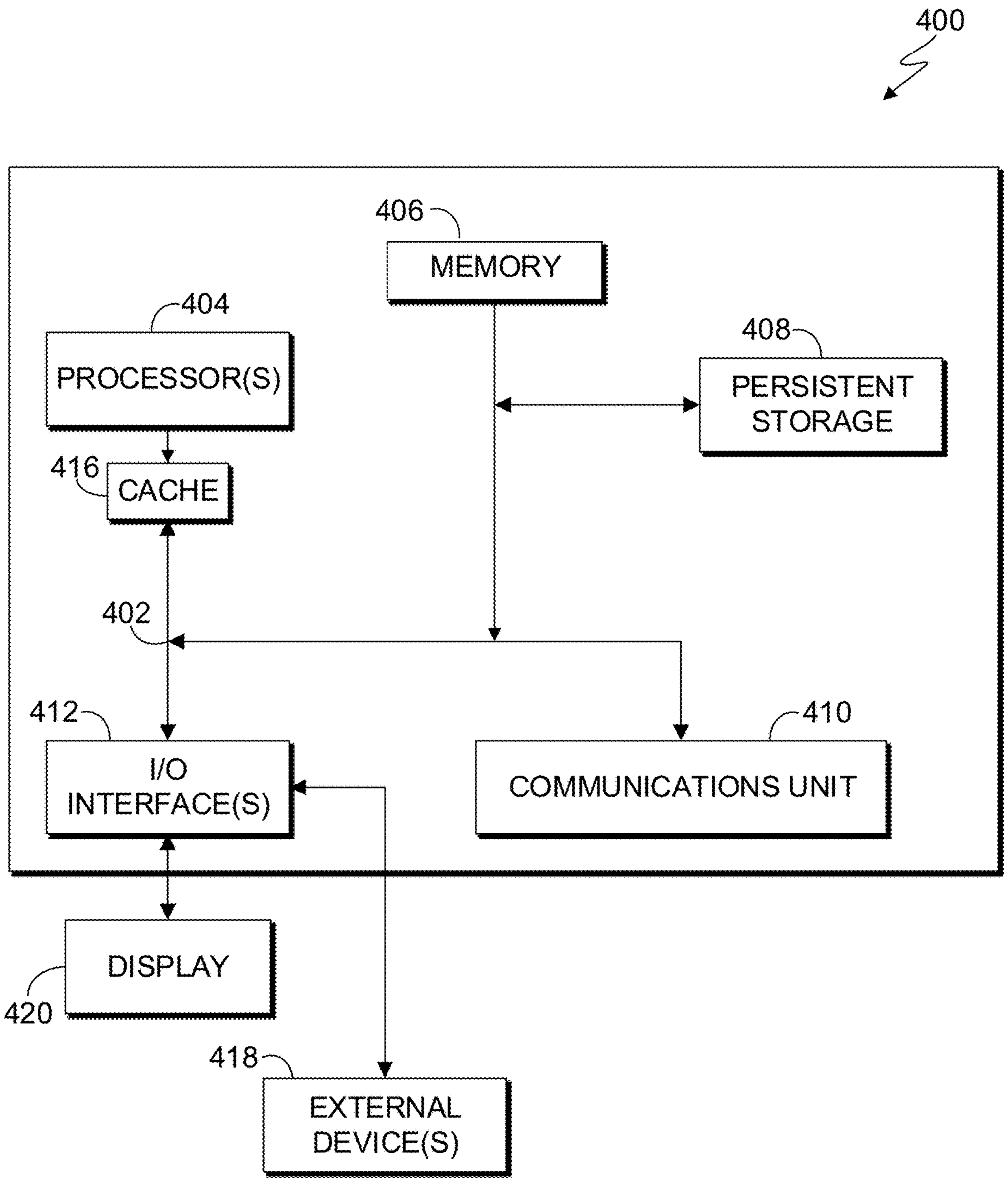
FIG. 4 depicts a block diagram of components of the server of the distributed data processing environment of FIG. 1, for running the emission source location program, in accordance with an embodiment of the present invention.

FIG. 4 depicts a block diagram of components of computing device 400, suitable for server 110 running emission source locator program 112 within distributed data processing environment 100 of FIG. 1, in accordance with an embodiment of the present invention. It should be appreciated that FIG. 4 provides only an illustration of one implementation and does not imply any limitations with regard to the environments in which different embodiments can be implemented. Many modifications to the depicted environment can be made.

Computing device 400 includes communications fabric 402, which provides communications between cache 416, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses or a crossbar switch.

Memory 406 and persistent storage 408 are computer readable storage media. In this embodiment, memory 406 includes random access memory (RAM). In general, memory 406 can include any suitable volatile or non-volatile computer readable storage media. Cache 416 is a fast memory that enhances the performance of computer processor(s) 404 by holding recently accessed data, and data near accessed data, from memory 406.

Programs may be stored in persistent storage 408 and in memory 406 for execution and/or access by one or more of the respective computer processors 404 via cache 416. In an embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links. Programs may be downloaded to persistent storage 408 through communications unit 410.

I/O interface(s) 412 allows for input and output of data with other devices that may be connected to server 110. For example, I/O interface 412 may provide a connection to external devices 418 such as a keyboard, keypad, a touch screen, and/or some other suitable input device. External devices 418 can also include portable computer readable storage media such as, for example, thumb drives, portable optical or magnetic disks, and memory cards. Software and data used to practice embodiments of the present invention can be stored on such portable computer readable storage media and can be loaded onto persistent storage 408 via I/O interface(s) 412. I/O interface(s) 412 also connect to a display 420.

Display 420 provides a mechanism to display data to a user and may be, for example, a computer monitor.

Programs described herein is identified based upon the application for which it is implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:

creating a dataset of plume concentration data by combining high-resolution synthetic plume data generated from a synthetic plume model having a higher spatial and temporal resolution than satellite data and a modeled distribution of actual plume data using satellite weather data, the dataset including synthetic plumes, corresponding positions and magnitudes, and the satellite weather data;

responsive to the high-resolution synthetic plume data having the higher spatial and temporal resolution, down sampling the dataset from the high-resolution synthetic plume data to a lower resolution array of synthetic plume data at satellite resolution, the dataset arranged as a first array of pixels with a plume at or near a center pixel of the first array;

partitioning the dataset of plume concentration data into two separate datasets according to a preset proportion as a training dataset and a validation dataset;

preparing the training dataset by recoding position entries of the plume as zero when a source of the plume is disposed outside the center pixel and as one for the source of the plume is contained in the center pixel;

training two machine learning models on at least one of the two separate datasets by:

training a first machine learning model to identify a presence of plumes; and training a second machine learning model to identify a source position and magnitude of the identified plumes;

applying the two machine learning models to each pixel, in sequence, of a data patch of a new set of actual plume concentration data to identify an actual plume, wherein the second machine learning model is applied responsive to the first machine learning model identifying the presence of a first plume at the pixel;

responsive to receiving an output from the second machine learning model of a subpixel position of a first plume source detected by the first machine learning model at a respective pixel, mathematically combining the respective pixel and the subpixel position to form a single coordinate; and logging the single coordinate of the actual plume to identify a position of the first plume.

2. The computer-implemented method of claim 1, wherein creating the dataset comprises:

using the synthetic plume model to compute two-dimensional concentration data for a plurality of wind and atmospheric conditions from a plurality of positions and at a plurality of magnitudes; and wherein the synthetic plume model is selected from the group consisting of: a superposition of gaussians (SOG) model, a puff model, and a computational fluid dynamics (CFD) model.

3. The computer-implemented method of claim 1, wherein creating the dataset comprises:

using collected actual two-dimensional satellite concentration data at a given resolution from known emission source locations.

4. The computer-implemented method of claim 1, wherein down sampling the dataset to the lower resolution array at the satellite resolution comprises:

down sampling the first array of pixels to a second array of pixels at the satellite resolution, wherein at least half of the second array of pixels contains the plume and a remainder containing no plume.

5. The computer-implemented method of claim 4, wherein down sampling the dataset to an array at satellite resolution comprises: encoding the source position of the plume in the second array of pixels as a single number corresponding to a pixel position relative to the center pixel; and aggregating data of the second array of pixels and the source position in a single dataset.

6. The computer-implemented method of claim 1, wherein the second machine learning model is applied responsive to the first machine learning model identifying the presence of the first plume at the center pixel of the array.

7. The computer-implemented method of claim 1, further comprising converting the array into a flattened array for processing by the machine learning models, wherein the flattened array is a one-dimensional array made by arranging the pixels of a two-dimensional array into a linear sequence.

8. The computer-implemented method of claim 1, further comprising excluding border pixels of the data patch from analysis by the set of machine learning models.

9. The computer-implemented method of claim 1, wherein applying the two machine learning models to each pixel comprises applying the two machine learning models to each pixel of a data patch comprising a plurality of neighboring pixels arranged as a two-dimensional array.

10. The computer-implemented method of claim 1, wherein logging the single coordinate of the actual plume comprises logging a plurality of coordinates corresponding to plume sources detected across multiple pixels of the data patch.

11. A computer program product comprising: one or more computer readable storage media and program instructions collectively stored on the one or more computer readable storage media, the stored program instructions comprising:

program instructions to create a dataset of plume concentration data by combining high-resolution synthetic plume data generated from a synthetic plume model having a higher spatial and temporal resolution than satellite data and a modeled distribution of actual plume data using satellite weather data, the dataset including synthetic plumes, corresponding positions and magnitudes, and the satellite weather data;

program instructions to, responsive to the high-resolution synthetic plume data having the higher spatial and temporal resolution, down sample the dataset from the high-resolution synthetic plume data to a lower resolution array of synthetic plume data at satellite resolution, the dataset arranged as a first array of pixels with a plume at or near a center pixel of the first array;

program instructions to partition the dataset of plume concentration data into two separate datasets according to a preset proportion as a training dataset and a validation dataset;

program instructions to prepare the training dataset by recoding position entries of the plume as zero when a source of the plume is disposed outside the center pixel and as one for the source of the plume is contained in the center pixel;

program instructions to train two machine learning models on at least one of the two separate datasets by:

training a first machine learning model to identify a presence of plumes; and training a second machine learning model to identify a source position and magnitude of the identified plumes;

program instructions to apply the two machine learning models to each pixel, in sequence, of a data patch of a new set of actual plume concentration data to identify an actual plume, wherein the second machine learning model is applied responsive to the first machine learning model identifying the presence of a first plume at the pixel;

responsive to receiving an output from the second machine learning model of a subpixel position of a first plume source detected by the first machine learning model at a respective pixel, mathematically combine the respective pixel and the subpixel position to form a single coordinate; and logging the single coordinate of the actual plume to identify a position of the first plume.

12. The computer program product of claim 11, wherein the program instructions to create the dataset comprise:

program instructions to use the synthetic plume model to compute two-dimensional concentration data for a plurality of wind and atmospheric conditions from a plurality of positions and at a plurality of magnitudes; and wherein the synthetic plume model is selected from the group consisting of: a superposition of gaussians (SOG) model, a puff model, and a computational fluid dynamics (CFD) model.

13. The computer program product of claim 11, wherein the program instructions to create the dataset comprise:

program instructions to use collected actual two-dimensional satellite concentration data at a given resolution from known emission source locations.

14. The computer program product of claim 11, wherein the program instructions to down sample the dataset to the array at the satellite resolution comprise:

program instructions to arrange the dataset as a first array of pixels with the plume at or near a center pixel of the first array; and program instructions to down sample the first array of pixels to a second array of pixels at the satellite resolution, wherein at least half of the second array of pixels contains the plume and a remainder containing no plume.

15. The computer program product of claim 14, wherein the program instructions to down sample the dataset to an array at satellite resolution comprise: program instructions to encode the source position of the plume in the second array of pixels as a single number corresponding to a pixel position relative to the center pixel; and program instructions to aggregate data of the second array of pixels and the source position in a single dataset.

16. A computer system comprising:

one or more computer processors;

one or more computer readable storage media; and program instructions collectively stored on the one or more computer readable storage media for execution by at least one of the one or more computer processors, the stored program instructions comprising:

program instructions to create a dataset of plume concentration data by combining high-resolution synthetic plume data generated from a synthetic plume model having a higher spatial and temporal resolution than satellite data and a modeled distribution of actual plume data using satellite weather data, the dataset including synthetic plumes, corresponding positions and magnitudes, and the satellite weather data;

program instructions to, responsive to the high-resolution synthetic plume data having the higher spatial and temporal resolution, down sample the dataset from the high-resolution synthetic plume data to a lower resolution array of synthetic plume data at satellite resolution, the dataset arranged as a first array of pixels with a plume at or near a center pixel of the first array;

program instructions to partition the dataset of plume concentration data into two separate datasets according to a preset proportion as a training dataset and a validation dataset;

program instructions to prepare the training dataset by recoding position entries of the plume as zero when a source of the plume is disposed outside the center pixel and as one for the source of the plume is contained in the center pixel;

program instructions to train two machine learning models on at least one of the two separate datasets by:

training a first machine learning model to identify a presence of plumes; and training a second machine learning model to identify a source position and magnitude of the identified plumes;

program instructions to apply the two machine learning models to each pixel, in sequence, of a data patch of a new set of actual plume concentration data to identify an actual plume, wherein the second machine learning model is applied responsive to the first machine learning model identifying the presence of a first plume at the pixel;

responsive to receiving an output from the second machine learning model of a subpixel position of a first plume source detected by the first machine learning model at a respective pixel, mathematically combine the respective pixel and the subpixel position to form a single coordinate; and logging the single coordinate of the actual plume to identify a position of the first plume.

17. The computer system of claim 16, wherein the program instructions to create the dataset comprise:

program instructions to use the synthetic plume model to compute two-dimensional concentration data for a plurality of wind and atmospheric conditions from a plurality of positions and at a plurality of magnitudes; and wherein the synthetic plume model is selected from the group consisting of: a superposition of gaussians (SOG) model, a puff model, and a computational fluid dynamics (CFD) model.

18. The computer system of claim 16, wherein the program instructions to create the dataset comprise:

program instructions to use collected actual two-dimensional satellite concentration data at a given resolution from known emission source locations.

19. The computer system of claim 16, wherein the program instructions to down sample the dataset to the array at the satellite resolution comprise: program instructions to arrange the dataset as a first array of pixels with the plume at or near a center pixel of the first array;

program instructions to down sample the first array of pixels to a second array of pixels at the satellite resolution, wherein at least half of the second array of pixels contains the plume and a remainder containing no plume;

program instructions to encode the source position of the plume in the second array of pixels as a single number corresponding to a pixel position relative to the center pixel;

and program instructions to aggregate data of the second array of pixels and the source position in a single dataset.

* * * * *